United States Patent
Lei et al.

(10) Patent No.: US 11,568,931 B2
(45) Date of Patent: Jan. 31, 2023

(54) READ-OUT CIRCUIT AND READ-OUT METHOD FOR THREE-DIMENSIONAL MEMORY

(71) Applicant: SHANGHAI INSTITUTE OF MICROSYSTEM AND INFORMATION TECHNOLOGY, CHINESE ACADEMY, Shanghai (CN)

(72) Inventors: Yu Lei, Shanghai (CN); Houpeng Chen, Shanghai (CN); Zhitang Song, Shanghai (CN)

(73) Assignee: SHANGHAI INSTITUTE OF MICROSYSTEM AND INFORMATION TECHNOLOGY, CHINESE ACADEMY OF SCIENCE, Shanghai (CN)

( * ) Notice: Subject to any disclaimer, the term of this patent is extended or adjusted under 35 U.S.C. 154(b) by 715 days.

(21) Appl. No.: 15/739,723

(22) PCT Filed: Apr. 25, 2017

(86) PCT No.: PCT/CN2017/081816
§ 371 (c)(1),
(2) Date: Dec. 26, 2019

(87) PCT Pub. No.: WO2018/152952
PCT Pub. Date: Aug. 30, 2018

(65) Prior Publication Data
US 2020/0126615 A1    Apr. 23, 2020

(30) Foreign Application Priority Data
Feb. 21, 2017  (CN) .......................... 201710092925.7

(51) Int. Cl.
    *G11C 11/00*    (2006.01)
    *G11C 13/00*    (2006.01)
(52) U.S. Cl.
    CPC .......... *G11C 13/004* (2013.01); *G11C 13/003* (2013.01); *G11C 13/0004* (2013.01);
    (Continued)
(58) Field of Classification Search
    CPC .............. G11C 13/0028; G11C 13/003; G11C 13/0038; G11C 2013/0045;
    (Continued)

(56) References Cited

U.S. PATENT DOCUMENTS

| 9,036,408 B1 * | 5/2015 | Jurasek .............. G11C 13/0004 365/207 |
| 2014/0078820 A1 * | 3/2014 | Li ....................... G11C 13/0004 365/163 |

(Continued)

*Primary Examiner* — Huan Hoang
*Assistant Examiner* — Minh Dinh
(74) *Attorney, Agent, or Firm* — Global IP Services; Tianhua Gu

(57) ABSTRACT

A read-out circuit and a read-out method for a three-dimensional memory, comprises a read reference circuit and a sensitive amplifier, the read reference circuit produces read reference current capable of quickly distinguishing reading low-resistance state unit current and reading high-resistance state unit current. The read reference circuit comprises a reference unit, a bit line matching module, a word line matching module and a transmission gate parasitic parameter matching module. With respect to the parasitic effect and electric leakage of the three-dimensional memory in the plane and vertical directions, the present invention introduces the matching of bit line parasite parameters, leakage current and transmission gate parasitic parameters into the read reference current, and introduces the matching of parasitic parameters of current mirror into the read current, (Continued)

thereby eliminating the phenomenon of pseudo reading and reducing the read-out time.

23 Claims, 7 Drawing Sheets

(52) U.S. Cl.
CPC ...... *G11C 13/0026* (2013.01); *G11C 13/0028* (2013.01); *G11C 13/0038* (2013.01); *G11C 2013/0045* (2013.01); *G11C 2013/0054* (2013.01)

(58) Field of Classification Search
CPC ........ G11C 2013/0054; G11C 2213/71; G11C 5/02; G11C 7/062; G11C 7/1051; G11C 13/0061
USPC ........................................................ 365/163
See application file for complete search history.

(56) References Cited

U.S. PATENT DOCUMENTS

| | | | | |
|---|---|---|---|---|
| 2016/0072461 | A1* | 3/2016 | Fritsch | ............... G11C 7/08 365/72 |
| 2018/0268898 | A1* | 9/2018 | Suzuki | ............... G11C 11/56 |

* cited by examiner

READ-OUT CIRCUIT AND READ-OUT METHOD FOR THREE-DIMENSIONAL MEMORY

CROSS REFERENCE TO RELATED PATENT APPLICATION

The present application is the US national stage of PCT/CN2017/081816 filed on Apr. 25, 2017, which claims the priority of the Chinese patent applications No. 2017100929257 filed on Feb. 21, 2017, which applications are incorporated herein by reference.

TECHNICAL FIELD

The present invention relates to technical field of integrated circuits, and in particular, to a read-out circuit and a read-out method for a three-dimensional memory.

BACKGROUND

Integrated circuit memory is widely used in industry and consumer electronic. Depending on whether the memory can be powered down or not, integrated circuit memory can be divided into volatile memory and non-volatile memory. Non-volatile memory comprises flash memory, magnetoresistive random-access memory (MRAM), resistance random-access memory (RRAM), phase change memory (PCM), and the like. Phase change memories are based on a memory having an Ovshinsky electronic effect and proposed by Ovshinsky in the late 1960s. The working principle of the phase change memory is as follows: since the phase change material which is produced to nanoscale will have different resistance states when it is in a low-resistance state (a crystalline state) and a high-resistance state (an amorphous state), the storage of data can therefore be achieved. Like the phase change memory, magnetoresistive random-access memory and resistance random-access memory store data according to different resistance states embodied by material or device when it is in a low resistance state (a crystalline state) and a high resistance state (an amorphous state).

Compared with two-dimensional memory, three-dimensional memory three-dimensionally arranges memory cells over a substrate to increase storage density. Wherein a cross point three-dimensional memory structure is widely used in each non-volatile memory. In this structure, the word line and the bit line form an angle of 90 degrees and are stacked layer by layer, and the memory cells exist at each cross point. FIG. 1 is a schematic diagram showing a three-dimensional non-volatile memory having a cross stacked structure. In the three-dimensional non-volatile memory having a cross stacked structure, a memory cells may be composed of a memory device and a selector.

T-dimensional memory is different from two-dimensional memory. In two-dimensional memory, the parasitic devices are mainly in the planar direction. However, in three-dimensional memory, the parasitic devices are in both vertical direction and planar direction. The number and complexity of the parasitic parameters in a three-dimensional memory are greatly larger than those in a two-dimensional memory. At the same time, a three-dimensional memory uses a new type of selecting devices, and the unselected bit lines and the unselected word lines are all needed. The offset method of a three-dimensional memory is completely different from that of a two-dimensional memory. The offset method of a three-dimensional memory is more complicated than that of a two-dimensional memory. In addition, the unique offset method will bring leakage current to a three-dimensional memory.

The data in non-volatile memory can be read out by measuring the resistors. By applying a certain voltage to the memory cell through a clamping circuit, the current flowing through the memory cell can be read and then the current is compared with a reference current, thereby judging the status of the memory cell. The read current will be affected by parasitic devices in the array, resulting in longer reading times. The reference current in previous three-dimensional memory and two-dimensional memory tends to be a constant value. As shown in FIG. 2, when a three-dimensional memory is read, a sensitive amplifier needs to simultaneously charge the parasitic capacitances of parasitic devices in a vertical direction and in a planar direction, and the parasitic capacitances in the sensitive amplifier in the array the current will then settle down. However, since the reference current in the prior art is always maintained between the reading high-resistance state current stable value and the reading low-resistance state current stable value, the phenomenon of pseudo-reading will be generated when the parasitic capacitance is charged, which greatly restricts the speed characteristics of the three-dimensional memory.

Factors which may affect the reading speed and accuracy of three-dimensional memory include, but are not limited to, the following points:

First, bit line parasitic parameters. Bit line parasitic parameters include the parasitic capacitances of the memory unit connected to a selected bit line, and are related to the number of word lines that are connected to the same bit line in the array.

Second, transmission gate parasitic parameters. Transmission gate parasitic parameters comprise parasitic resistances and parasitic capacitances of the transmission gate, and are related to the number of local bit lines that are connected to the same global bit line and the number of bit lines that are connected to the same local bit line in the memory array.

Third, parasitic parameters of current mirror in the sensitive amplifier. The parasitic parameters of the current mirror in a sensitive amplifier include the parasitic capacitance of the current mirror, and are related to the number of sensitive amplifiers that are connected to the same read reference circuit.

Fourth, leakage current. When the voltage across the memory cell is 0, the memory cell is not gated. When the voltage across the memory cell is V, the memory cell is gated. Wherein V is the bit line voltage when the memory cell is read or written. When the voltage across the memory cell is V/2, the memory cell is half-gated, the selector is shut down at this time, but there will be leakage current. Leakage current consists of the leakage current of a memory cell on the selected bit line and the leakage current of a memory cell on the selected word line. The leakage current mainly depends on the electrical properties of the selector. If the leakage current of the half-gated memory cell is small (i.e., <1 pA), the effect of leakage current can be neglected. If the leakage current of the half-gated memory cell is large (i.e., >5 pA), the leakage current will cause misreading and affect the reading speed.

Therefore, how to improve the problem that the read-out time is excessively long and how to improve the speed characteristic of the three-dimensional memory have become a technical problem to be solved urgently by those skilled in the art.

SUMMARY

In view of the above disadvantages of the prior art, an object of the present invention is to provide a read-out circuit and a read-out method for three-dimensional memory for solving the problem in the prior art that the read-out time of read-out circuit of the three-dimensional memory is too long.

To achieve the above object and other related objects, the present invention provides a read-out circuit for a three-dimensional memory, the read-out circuit for a three-dimensional memory at least comprises:

A three-dimensional memory cell array comprising at least one three-dimensional memory cell sub-array and a plurality of sensitive amplifiers corresponding to the three-dimensional memory cell sub-array; wherein each of bit lines in the three-dimensional memory cell array is respectively connected with the corresponding sensitive amplifiers through transmission gates; the sensitive amplifiers are connected with read reference circuits and the corresponding memory cells and compares the read reference current with the current read out from the selected memory cell and to generate a read-out voltage signal of the selected memory cell;

A read reference circuit for generating a read reference voltage or a read reference current, comprising: a reference unit, a bit line matching module, a transmission gate parasitic parameter matching module and a first damper tube;

Wherein the reference unit is connected between a reference word line and a reference bit line for providing a reference resistance value;

The bit line matching module is connected between the reference bit line and a denselected word line for providing bit line parasitic parameters and electric leakage to match the bit line parasitic parameters in the three-dimensional memory cell array and the electric leakage of the memory cell on the bit line;

The transmission gate parasitic parameter matching module is connected between the reference bit line and a source terminal of the first damper tube for providing transmission gate parasitic parameters to match the transmission gate parasitic parameters in the three-dimensional memory cell array;

The first damper tube obtains the read reference current according to the bit line parasitic parameters and electric leakage provided by the reference resistance value and the bit line matching module, and the transmission gate parasitic parameter provided by the transmission gate parasitic parameters matching module.

Preferably, the read-out circuit for a three-dimensional memory further comprises: a word line matching module connected between the reference word line and a deselected bit line for providing electric leakage on the word line to match the electric leakage of the memory cells on the word line in the three-dimensional memory cell array; the first damper tube obtains the read reference current according to the reference resistance value, the bit line parasitic parameter and the electric leakage provided by the bit line matching module, the electric leakage provided by the word line matching module, and the transmission gate parasitic parameters provided by transmission gate parasitic parameter matching module.

Preferably, the word line matching module comprises (a−1) memory cells connected in parallel, wherein a is the number of bit lines connected to the same word line in the three-dimensional memory cell array.

Preferably, the reference unit comprises a reference resistor and a gating tube, wherein one end of the gating tube is connected to the reference word line, and one end thereof is connected to an end of the reference resistor; and the other end of the reference resistor is connected to the reference bit line.

Preferably, the resistance value of the reference resistor is between the maxmium of low-resistance state and the minimum of high resistance state.

Preferably, the gating tube and the gating tube in the memory cell are the same type.

Preferably, the bit line matching module comprises (n−1) memory cells connected in parallel, wherein n is the number of word lines that are connected to the same bit line in the three-dimensional memory cell array.

Preferably, the transmission gate parasitic parameter matching module comprises a first transmission gate, a second transmission gate, a local transmission gate parasitic parameter matching unit and a global transmission gate parasitic parameter matching unit; the first transmission gate and the second transmission gate are connected in series between the reference bit line and the source terminal of the first damper tube; a connection line between the first transmission gate and the second transmission gate is used as a local reference bit line, a connection line between the second transmission gate and the first damper tube is used as a global reference bit line; the local transmission gate parasitic parameter matching unit is connected between the local reference bit line and the deselected bit line for providing the transmission gate parasitic parameters to match the local transmission gate parasitic parameters in the three-dimensional memory cell array; the global transmission gate parasitic parameter matching unit is connected between the global reference bit line and ground for providing transmission gate parasitic parameters to match the global transmission gate parasitic parameters in the three-dimensional memory cell array.

Preferably, the local transmission gate parasitic parameter matching unit comprises (m−1) third transmission gates connected in parallel, wherein m is the number of bit lines connected to the same local bit line; the structure and size of each of the third transmission gates are the same as those of the first transmission gate in the read reference circuit and the same as those of each of the local transmission gates in the three-dimensional memory cell array; one end of each of the third transmission gates is connected to the local reference bit line and another end is connected to the deselected bit line, and the control end thereof is connected to the ground.

Preferably, the global transmission gate parasitic parameter matching unit comprises (c−1) fourth transmission gates connected in parallel, wherein c is the number of local bit lines connected to the same global bit line; the structure and size of each of the fourth transfer gates are the same as those of the second transmission gate in the read reference circuit and the same as those of each of the global transmission gates in the three-dimensional memory cell array; one end of each of the fourth transmission gates is connected to the global reference bit line, another end thereof is connected to the ground, and the control end thereof is connected to the ground.

Preferably, the read reference circuit further comprises: a voltage conversion module for converting the read reference current into a read reference voltage, the voltage conversion module comprises a first PMOS transistor; wherein a source terminal of the first PMOS transistor is connected to power supply voltage, a gate terminal is connected with the drain terminal and is used as the output end of the read reference voltage, and the drain terminal is further connected to the drain terminal of the first damper tube.

Preferably, the read reference circuit further comprises: a bit line driving module connected to an input end of the reference bit line for driving the reference bit line; the bit line driving module comprises a first NMOS transistor, a source terminal of the first NMOS transistor is connected with a deselected bit line signal, a gate terminal of the first NMOS transistor is connected with an inverted signal of an enable signal, and a drain terminal of the first NMOS transistor is connected with the reference bit line.

Preferably, the read reference circuit further comprises: a word line driving module connected to an input end of the reference word line for driving the reference word line; the word line driving module comprises a second NMOS transistor and a second PMOS transistor, a source terminal of the second NMOS transistor is connected to the ground, a gate terminal of the second NMOS transistor is connected to an enable signal, and a drain terminal of the second NMOS transistor is connected to the reference word line; a source terminal of the second PMOS transistor is connected to a deselected word line, a gate terminal of the second PMOS transistor is connected to an enable signal, and a drain terminal of the second PMOS transistor is connected to the reference word line.

Preferably, the sensitive amplifier comprises a second damper tube having a source terminal connected to the memory cell, a current mirror connected with the drain terminal of the second damper tube, a current conversion module connected to the read reference voltage, and a comparison module; a gate terminal of the second damper tube is connected to a clamp voltage; the current mirror extracts the read current in the selected memory cell; the current conversion module converts the read reference voltage into a read reference current; the comparison module is connected with the current mirror and the current conversion module and compares the read current in the selected memory cell with the read reference current; and the comparison result indicates a signal stored in the selected memory cell.

More preferably, the sensitive amplifier further comprises a current mirror parasitic parameter matching module for counteracting the parasitic effect of the current mirror in each sensitive amplifier; the current mirror parasitic parameter matching module comprises a third NMOS transistor having a gate terminal and a source terminal grounded, and 2(b−1) third PMOS transistor connected in parallel; a source terminal of each of the third PMOS transistors is connected to a supply voltage, a drain terminal of each of the third PMOS transistors is connected to the drain terminal of each of the third NMOS transistors, and a gate terminal of each of the third PMOS transistors is connected to an input end of the current mirror; the size of each of the third PMOS transistors is the same as that of each transistor in the current mirror, wherein b is the number of the sensitive amplifiers connected to the same read reference circuit in the three-dimensional memory cell array.

Preferably, the deselected word line is connected to a voltage source of the deselected word line, and the voltage of the voltage source causes the memory cell not to be selected.

More preferably, the deselected bit line is connected to a voltage source of the deselected bit line, and the voltage of the voltage source causes the memory cell not to be selected.

To achieve the above object and other related objects, the present invention provides a method for reading out the read-out circuit for three-dimensional memory, and the read-out method for three-dimensional memory at least comprises:

Selecting one word line and one bit line, and connecting one memory cell in the three-dimensional memory cell array to a sensitive amplifier, wherein the sensitive amplifier reads the read current of the memory cell;

At the time that the word line, the bit line, and the sensitive amplifier start to work, the read reference circuit begins to work and generates a dynamic read reference current, and a transient value of the read reference current is between a read low-resistance state current and a read high resistance state current;

The sensitive amplifier compares the read current of the selected memory cell with the read reference current and generates a read-out voltage signal of the selected memory cell.

Preferably, the bit line parasitic parameter and the electric leakage on a bit line are introduced into the read reference current to counteract an array bit line parasitic effect generated when a memory cell is read, and the electric leakage of the memory cell on a bit line, thereby eliminating the phenomenon of pseudo-reading reducing the time for reading out signals, and reducing misreading.

Preferably, the leakage current on the word line is introduced into the read reference current to counteract the electric leakage of the memory cell on the word line when the memory cell is read, thereby eliminating the phenomenon of pseudo-reading and reducing the time for reading out signals.

Preferably, a transmission gate parasitic parameter is introduced into the read reference current to counteract the parasitic effect of the array transmission gate generated when the memory cell is read, thereby eliminating the phenomenon of pseudo-reading and reducing the time for reading out signals.

Preferably, a current mirror parasitic parameter is introduced into the read current of the selected memory cell to match mirror image parameters of the read current of the selected memory cell with mirror image parameters of the reference current, thereby eliminating the phenomenon of pseudo-reading and reducing the time for reading out signals.

Preferably, when the read current of the selected memory cell is larger than the reference current, the memory cell is in a low resistance state; when the read current of the selected memory cell is smaller than the reference current, the memory cell is in a high resistance state.

As described above, the read-out circuit and read-out method for a three-dimensional memory according to the present invention have the following beneficial effects:

1. In the read-out circuit and read-out method for a three-dimensional memory according to the present invention, the read reference circuit does not start to work until the read signal is sent; the matching of the parasitic parameters of the bit line, the matching of the parasitic parameters of the transmission gate and the matching of leakage current of bit line and word line are introduced into the read reference current, and the matching of the parasitic parameters of current mirror is introduced into the read current, such that the transient curve of the read reference current is between the reading high- resistance state current and the reading low-resistance state current, thereby eliminating the phenomenon of pseudo-reading and reducing the read-out time.

2. In the read-out circuit and read-out method for a three-dimensional memory according to the present invention, the read reference current and the read current have the same leakage current, thereby reducing misreading.

3. The read-out circuit and read-out method for a three-dimensional memory according to the present invention can greatly reduce the read-out time for a three-dimensional memory with a scale from 1 Mb to 1 Tb, and has a wide range of applications.

Figure 1:
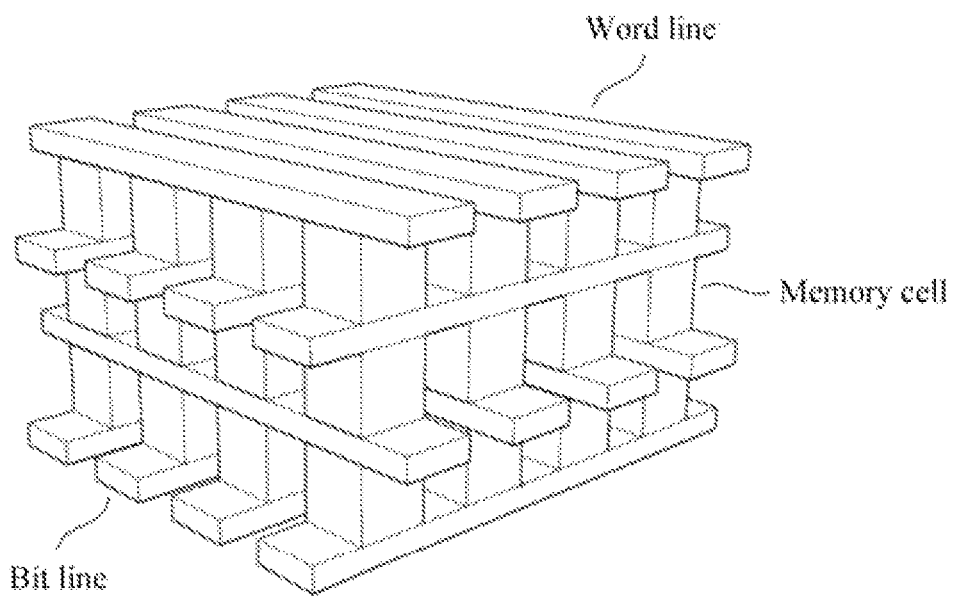
FIG. 1 is a schematic diagram showing a three-dimensional non-volatile memory having a cross-stacked structure.

Descriptions of Component Mark Numbers 1 three-dimensional memory cell array
11 three-dimensional memory cell sub-array
111 memory cell
1111 first memory device
1112 first selector
12 sensitive amplifier
121 second damper tube
122 current mirror parasitic parameter matching module
2 read reference circuit
21 reference unit
211 second selector
22 bit line driving module
23 word line driving module
24 bit line matching module
241 first bit line matching unit
242 second bit line matching unit
25 transmission gate parasitic parameter matching module
251 local transmission gate parasitic parameter matching unit
252 global transmission gate parasitic parameter matching unit
26 first damper tube
27 voltage conversion module
28 word line matching module
S1~S2 step

DETAILED DESCRIPTION OF THE PREFERRED EMBODIMENTS

The implementation modes of the present invention will be described below through specific examples. One skilled in the art can easily understand other advantages and effects of the present invention according to contents disclosed in the description. The present invention may also be implemented or applied through other different specific implementation modes. Various modifications or variations may be made to all details in the description based on different points of view and applications without departing from the spirit of the present invention.

Please refer to FIGS. 3 to 9. It needs to be stated that the drawings provided in the embodiments are just used for schematically describing the basic concept of the present invention, thus only illustrate components only related to the present invention and are not drawn according to the numbers, shapes and sizes of components during actual implementation, the configuration, number and scale of each component during actual implementation thereof may be freely changed, and the component layout configuration thereof may be more complex.

Embodiment One

Figure 3:
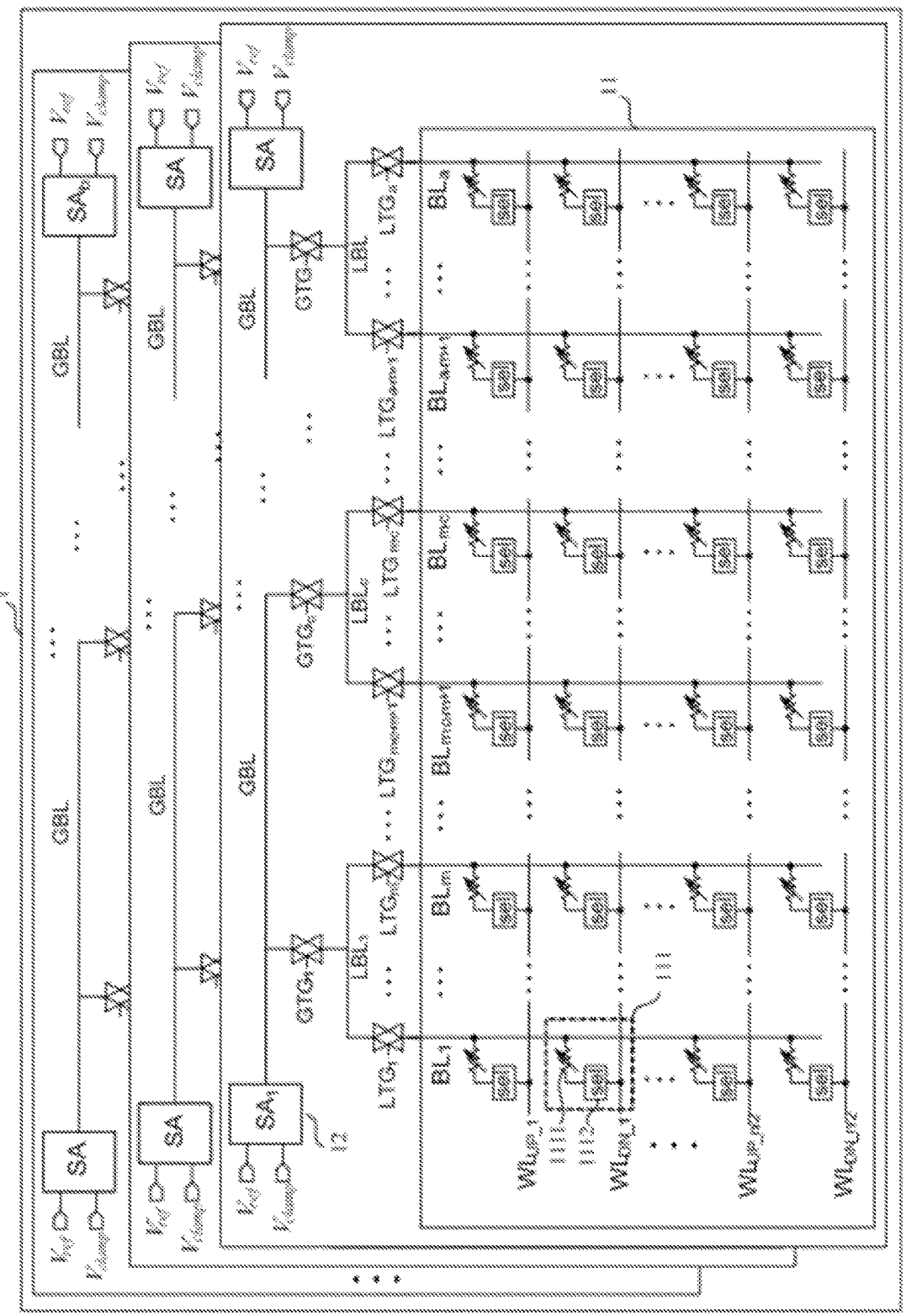
FIG. 3 is a schematic diagram showing a three-dimensional memory cell array according to the present invention.
Figure 4:
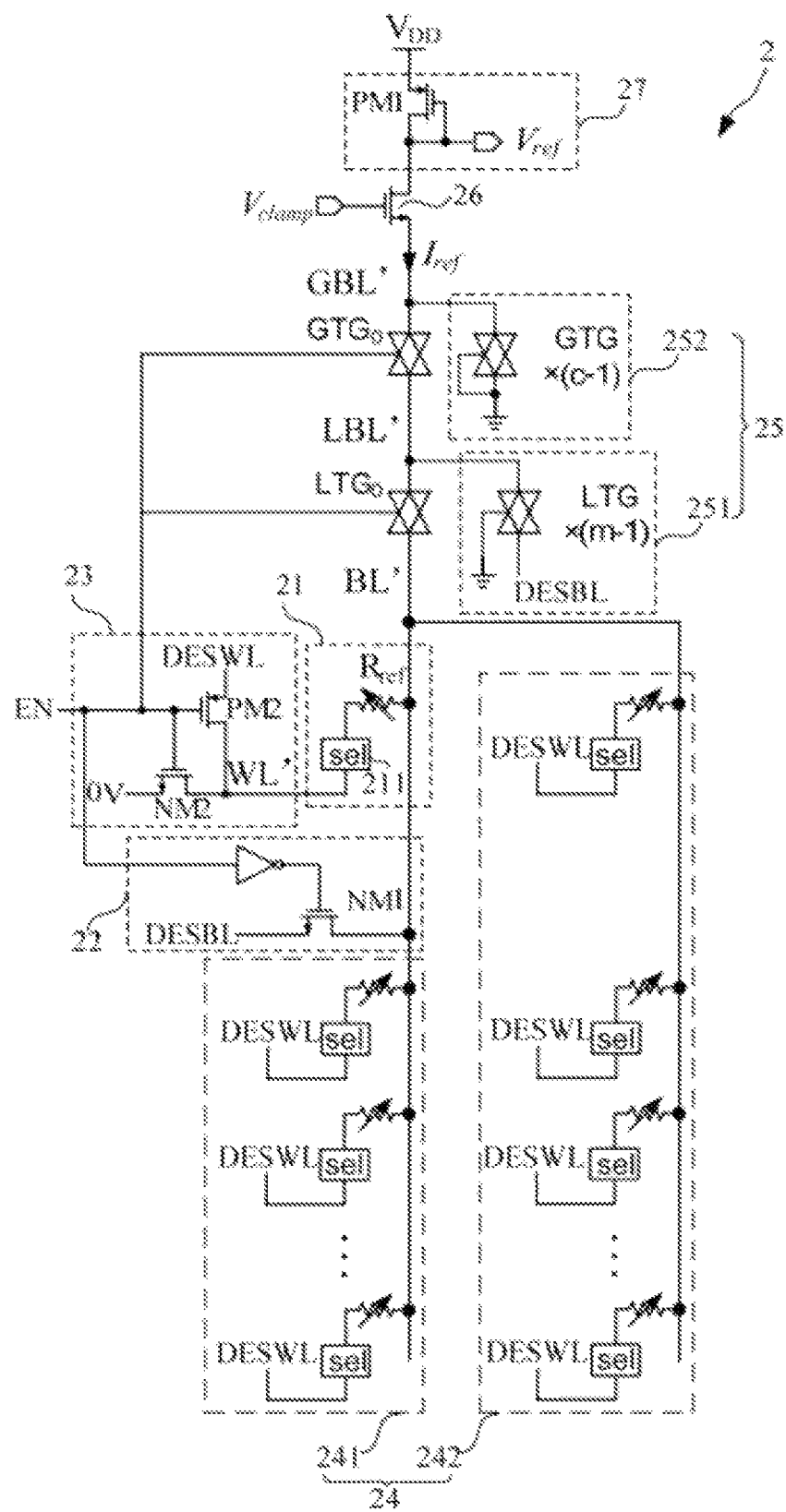
FIG. 4 shows an embodiment of a read reference circuit according to the present invention.
Figure 5:
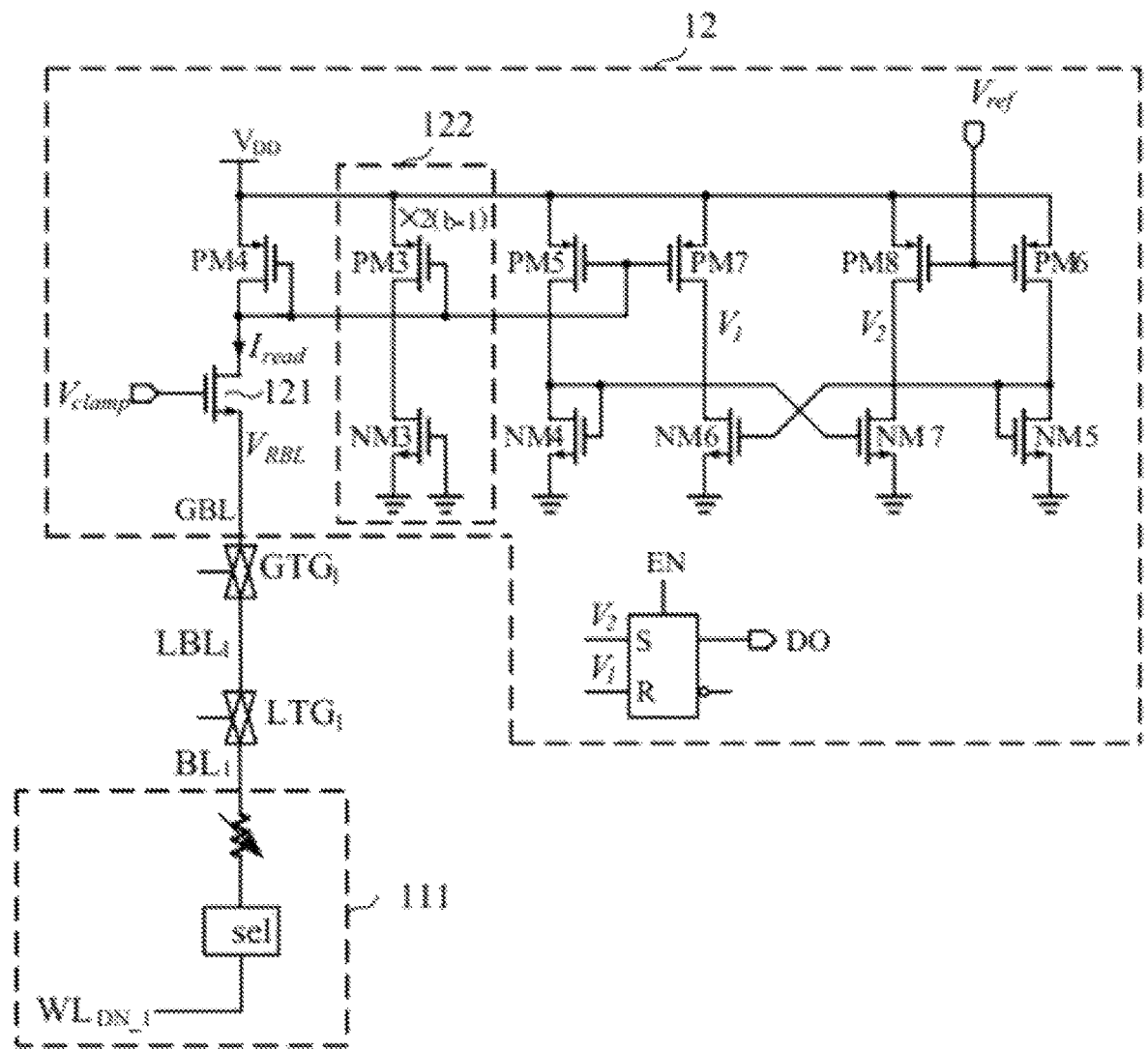
FIG. 5 is a schematic diagram showing the working principle of the sensitive amplifier according to the present invention.

As shown in FIGS. 3-5, the present invention provides a read-out circuit for a three-dimensional memory including a three-dimensional memory cell array 1 and a read reference circuit 2.

As shown in FIG. 3, the three-dimensional memory cell array 1 includes at least one three-dimensional memory cell sub-array 11 and a plurality of sensitive amplifiers 12 corresponding to the three-dimensional memory cell sub-array. Each bit line in the three-dimensional memory cell array 1 is respectively connected through a transmission gate to a corresponding sensitive amplifier 12. The sensitive amplifier 12 is connected with the read reference circuit 2 and a corresponding memory cell, and compares the read reference current with the current read out from the selected memory cell to generate a read out voltage signal of the selected memory cell.

Specifically, as shown in FIG. 3, in this embodiment, the three-dimensional memory cell array 1 comprises three three-dimensional memory cell sub-arrays 11, which can be set as needed in actual design and is not limited to this embodiment. In the three-dimensional memory cell array 1, both a upper memory cell and a lower memory cell use the same bit line; a global bit line GBL one-to-one corresponds to the sensitive amplifier; the number of the sensitive amplifiers 12 is set as b, and the b sensitive amplifiers are connected to the same read reference circuit to receive the read reference voltage or read reference current. In this embodiment, the number of word lines or memory cells that are connected to the same bit line in the three-dimensional memory cell sub-array 11 is set as n; the number of bit lines or memory cells that are connected to the same word line in the three-dimensional memory cell sub-array 11 is set as a; the number of bit lines BL that are connected to the same local bit line LBL in the three-dimensional memory cell sub-array 11 is set as m; each bit lines BL is respectively connected to the local bit line LBL through the local transmission gate; the number of local bit lines LBL connected to the same global bit line GBL in the three-dimensional memory cell sub-array 11 is set as c; each of the local bit lines LBL is connected with the global bit line GBL through the global transmission gate; that is, the number of bit lines BL connected to the same sensitive amplifier 12 are set as mc. Specific values can be set according to actual needs and will not be defined herein.

More specifically, as shown in FIG. 3, the memory cell sub-array 11 comprises a plurality of memory cells 111, wherein (n*m) memory cells 111 constitute an array and are connected to a same local bit line; the row control signals are word line signals $WL_{UP\_1} \sim WL_{UP\_n/2}$ and $WL_{DN\_1} \sim WL_{DN\_n/2}$ (respectively control the upper and lower memory cells 111); the column transmission signals are bit line signals $BL_1 \sim BL_m$; only one word line WL and only one bit line BL are turned on at a same time; a memory cell 111 is connected with a local bit line LBL. The bit line BL is connected to the local bit line LBL through the local transmission gate LTG; and the local bit line LBL is connected to the global bit line GBL through the global transmission gate GTG The memory cell 111 comprises a first memory device 1111 and a first selector 1112. The memory device may be an OMS effect device and the selector may be an OTS effect device, which is not limited to this embodiment. In this embodiment, taking the lower memory cell in the first row and the first column as an example, one end of the first memory device 1111 is firstly connected to the first transmission gate $LTG_1$ and the first global transmission gate $GTG_1$, and then is connected with the first sensitive amplifier; the other end of the first memory device 1111 is connected to one end of the first selector 1112; the other end of the first selector 1112 is connected to the first word line $WL_{DN\_1}$.

As shown in FIG. 4, the read reference circuit 2 is connected to the sensitive amplifier 12 for generating a read reference voltage Vref or a read reference current Iref. In this embodiment, the read reference voltage Vref is taken as an example. The read reference circuit 2 comprises a reference unit 21, a bit line driving module 22, a word line driving module 23, a bit line matching module 24, a transmission gate parasitic parameter matching module 25, a first damper tube 26, and a voltage conversion module 27.

Specifically, as shown in FIG. 4, the reference unit 21 is connected between the reference word line WL' and the reference bit line BL' for providing a reference resistance value. The reference unit 21 comprises a reference resistor Rref and a second selector 211, wherein one end of the second selector 211 is connected to the output end of the word line driving module 25 through the reference word line WL', and the other end thereof is connected to one end of the reference resistor Rref; the other end of the reference resistor Rref is connected to the reference bit line BL'. The resistance of the reference resistor Rref is between the maximum of the low resistance state and the minimum of the high resistance state. The second selector 211 is of the same type as the first selector 1112 in the memory cell 111.

Specifically, as shown in FIG. 4, the bit line driving module 22 is connected to the reference bit line BL' for driving the reference bit line BL'. The bit line driving module 22 comprises a first NMOS transistor NM1 having a source terminal connected to an deselected bit line signal DESBL, a gate terminal connected to an inverted signal of an enable signal EN (in the present embodiment, the inverted signal is obtained by connecting the enable signal EN with an inverter), and a drain terminal connected to the reference bit line BL'. The first NMOS transistor NM1 is used as a bit line and is not driven. When the enable signal EN is inactive (low level), the first NMOS transistor NM1 is turned on, the reference bit line BL' is connected with the deselected bit line deselected bit line voltage source through the deselected bit line DESBL, and the reference bit line BL' is not selected. When the enable signal EN is enabled (high level), the first NMOS transistor NM1 is turned off. In this embodiment, when the memory is read, the local bit line voltage is VBL, and the voltage of the deselected bit line voltage source is VBL/2.

Specifically, as shown in FIG. 4, the word line driving module 23 is connected to the input end of the reference word line WL' for driving the reference word line WL'. The word line driving module 23 includes a second NMOS transistor NM2 and a second PMOS transistor PM2. A source terminal of the second NMOS transistor NM2 is grounded (0V), a gate terminal is connected to an enable signal EN, and a drain terminal is connected to the reference word line WL'. A source terminal of the second PMOS transistor PM2 is connected to the deselected word line DESWL, a gate terminal thereof is connected to an enable signal EN, and a drain terminal thereof is connected to the reference word line WL'. The second NMOS transistor NM2 and the second PMOS transistor PM2 are respectively used as a driver of the word line selection and a driver of the word line deselection. When the enable signal EN is inactive (low level), the second PMOS transistor PM2 is turned on, the reference word line WL' is connected to the deselected word line voltage source through the deselected word line DESWL, and the reference unit 21 is deselected. When the enable signal EN is enabled (high level), the second NMOS transistor NM2 is turned on, the reference word line WL' is connected to a low level (0V), and the reference unit 21 is selected. In the present embodiment, when the memory is read, the local word line voltage is VBL, and the voltage of the deselected word line voltage source is VBL/2.

Specifically, as shown in FIG. 4, the bit line matching module 24 is connected between the reference bit line BL' and the deselected word line DESWL for providing bit line parasitic parameters and electric leakage to match the bit line parasitic parameters in the three-dimensional memory cell array 1 and electric leakage of memory cells on the bit line.

More specifically, the bit line matching module 24 includes (n−1) memory cells connected in parallel, wherein n is the number of word lines that are connected to the same bit line in the three-dimensional memory cell array 1. As shown in FIG. 4, the bit line matching module 24 can be divided into a first bit line matching cell 241 and a second bit line matching cell 242. Wherein the first bit line matching cell 241 comprises (n/2−1) memory cells for matching the bit line parasitic parameters of the lower memory cell and the electric leakage on the first bit line BL1. The second bit line matching cell 242 comprises (n/2) memory cells for matching the bit line parasitic parameter of the upper memory cell and the electric leakage on the first bit line BL1 (the cell corresponding to the selected memory cell in this embodiment is the lower memory cell in the first column and the first column). n is the number of word lines WL that are connected to the same bit line BL in the three-dimensional memory cell array 1. When a certain memory cell is read, the remaining (n−1) memory cells in its column are in an off state, and the parasitic capacitances of the first memory device 1111 and the first selector 1112 affect the read current Iread. By providing the first bit line matching unit 241 and the second bit line matching unit 242, a parasitic charging current matched with the three-dimensional memory cell array 1 can be introduced into the read reference current Iref, and the variation trend of the read reference current Iref is consistent with that of the read current, thereby eliminating the phenomenon of pseudo-read and reducing the time for reading out signals.

Specifically, as shown in FIG. 4, the transmission gate parasitic parameter matching module 25 is connected between the reference bit line BL' and the source terminal of the first damper tube 26 for providing transmission gate parasitic parameters to match the transmission gate parasitic parameters in the three-dimensional memory cell array 1. The transmission gate parasitic parameter matching module 25 comprises a first transmission gate LTG0, a second transmission gate GTG0, a local transmission gate parasitic parameter matching unit 251, and a global transmission gate parasitic parameter matching unit 252.

More specifically, the first transmission gate LTG0 and the second transmission gate GTG0 are connected in series between the reference bit line BL' and the source terminal of the first damper tube 26. The first transmission gate LTG0 is a local transmission gate, and the second transmission gate GTG0 is a global transmission gate. The connection line between the first transmission gate LTG0 and the second transmission gate GTG0 is used as a local reference bit line LBL', and the connection line between the second transmission gate GTG0 and the first damper tube 26 is used as a global reference bit line GBL'.

More specifically, the local transmission gate parasitic parameter matching unit 251 is connected between the local reference bit line LBL' and the deselected bit line DESBL for providing transmission gate parasitic parameters to match the local transmission gate parasitic parameters in the three-dimensional memory cell array 1. The local transmission gate parasitic parameter matching unit 251 comprises (m−1) third transmission gates LTG connected in parallel, wherein m is the number of bit lines that are connected to the same local bit line LBL in the three-dimensional memory cell array 1. The third transmission gate LTG has the same structure and dimension as those of the first transmission gate LTG0 and each of local transmission gates in the three-dimensional memory cell array 1. One end of each the third transmission gate LTG is connected to the local reference bit line LBL', another end is connected to the deselected bit line DESBL, the control end is grounded and is always in a non-conductive state. The local transmission gate parasitic parameter matching unit 251 is used to match local transmission gate parasitic parameters. When a memory cell is read, the local transmission gate connected thereto is turned on, and the remaining (m−1) local transmission gates are in an off state. The parasitic capacitance and the parasitic resistance on the transmission gate have an influence on the read current Iread. By providing the local transmission gate parasitic parameter matching unit 251, a local transmission gate parasitic current matched with the three-dimensional memory cell array 1 can be introduced into the read current Iread, and the obtained read reference current Iref have a same variation trend with the read current Iread, thereby eliminating the phenomenon of pseudo-reading and reducing the time for reading out signals.

More specifically, the global transmission gate parasitic parameter matching unit 252 is connected between the global reference bit line GBL' and the ground for providing transmission gate parasitic parameters to match the global transmission gate parasitic parameters in the three-dimensional memory cell array 1. The global transmission gate parasitic parameter matching unit 252 comprises (c−1) fourth transmission gates GTG connected in parallel, wherein c is the number of local bit lines in the three-dimensional memory cell array 1 that are connected to the same global bit line GBL. Each the fourth transmission gate GTG has the same structure and dimension as those of the second transmission gate GTG0 and each of the global transmission gates in the three-dimensional memory cell array 1. One end of each the fourth transmission gate GTG is connected to the global reference bit line GBL', and another end thereof is connected to the ground, the control end is connected to the ground and is always in a non-conductive state. The global transmission gate parasitic parameter matching unit 252 is used to match a global transmission gate parasitic parameter. When a memory cell is read, the global transmission gate connected thereto is turned on, and the remaining (c−1) global transmission gates are in an off state. The parasitic capacitance and the parasitic resistance on the transmission gate have an effect on the read current Iread. By providing the global transmission gate parasitic parameter matching unit 252, a global transmission gate parasitic parameter matching unit matched with the three-dimensional memory cell array 1 can be further introduced into the read current Iread, and the variation trends of the obtained read reference current Iref is consistent with that of the read current Iread, thereby eliminating the phenomenon of pseudo-reading and reducing the time for reading out signals.

As shown in FIG. 4, the clamp transistor 26 obtains the read reference current Iref according to the reference resistance value, the bit line parasitic parameters and electric leakage provided by the first bit line matching unit 241 and the second bit line matching unit 242, and the transmission gate parasitic parameter provided by the local transmission gate parasitic parameter matching unit 251 and the global transmission gate parasitic parameter matching unit 252.

Specifically, as shown in FIG. 4, a source terminal of the first damper tube 26 is connected to the global reference bit line GBL', a gate terminal thereof is connected to a clamp voltage Vclamp, and a drain terminal thereof is connected to a voltage conversion module 27.

As shown in FIG. 4, the voltage conversion module 27 is connected to the drain terminal of the first damper tube 26 for converting the read reference current Iref into a read reference voltage Vref.

Specifically, as shown in FIG. 4, the voltage conversion module 27 comprises a first PMOS transistor PM1. A source terminal of the first PMOS transistor PM1 is connected to a supply voltage $V_{DD}$, and a gate terminal thereof is connected to the drain terminal and is used as an output end of the read reference voltage Vref. The drain terminal is also connected to the drain terminal of the first damper tube 26. The structure of the voltage conversion module 27 is not limited, and any circuit having a current-to-voltage function is applicable, which is not limited to the embodiment.

As shown in FIG. 3, the sensitive amplifier 12 corresponds to the three-dimensional memory cell sub-array 11. In this embodiment, the mc bit lines are connected to the same sensitive amplifier, and the sensitive amplifier 12 is respectively connected to the bit lines in the three-dimensional memory cell sub-array 11 through the transmission gate, and is connected with the read reference circuit 2 to receive the read reference current Iref or the read reference voltage Vref (in this embodiment, the read reference voltage Vref is received). The sensitive amplifier 12 restores the read reference voltage Vref to a read reference current Iref, and compares the read reference current Iref with the read current Iread of the selected memory cell 111 in the three-dimensional memory cell array 1 to generate the read-out voltage signal of the selected memory cell 111.

Specifically, as shown in FIG. 5, the sensitive amplifier 12 comprises a second damper tube 121 having a source terminal connected to the memory cell 111, a current mirror connected to the drain terminal of the second damper tube 121, a current mirror parasitic parameter matching module 122, a current conversion module connected to the read reference voltage Vref, a comparison module, and an SR latch.

More specifically, the gate terminal of the second damper tube 121 is connected to the clamp voltage Vclamp, and the read current Iread in the selected memory cell 111 is generated under the control of the clamp voltage Vclamp. The current mirror extracts the read current Iread from the selected memory cell 111, including the fourth PMOS transistor PM4 and the fifth PMOS transistor PMS. The current mirror parasitic parameter matching module 122 includes a third NMOS transistor NM3 having a gate terminal and a source terminal grounded and 2(b−1) third PMOS transistors PM3 connected in parallel. A source terminal of each the third PMOS transistor PM3 is connected to the supply voltage $V_{DD}$, the drain terminal thereof is connected to the drain terminal of the third NMOS transistor NM3, and the gate terminal thereof is connected to the input end of the current mirror. The size of each the third PMOS transistor PM3 is the same as that of the fourth PMOS transistor PM4, the fifth PMOS transistor PMS, the sixth PMOS transistor, the seventh PMOS transistor PM7, the eighth PMOS transistor PM8, and the first PMOS transistor PM1 in the three-dimensional memory cell array 1. Wherein b is the number of the sensitive amplifiers in the three-dimensional memory cell array 1 that are connected to the same read reference current. The current mirror parasitic parameter matching module 122 is used to match the current mirror parasitic parameters. Since the read reference voltage Vref is simultaneously connected to the b sensitive amplifiers, the current mirror parasitic parameters generated when the remaining (b−1) sensitive amplifier converts the read reference current Iref will inevitably be introduced into the read reference voltage Vref. In the present embodiment, the mirror image of the read reference current Iref is realized by the sixth PMOS transistor PM6 and the eighth PMOS transistor PM8. Therefore, the number of the third PMOS transistor PM3 is set as 2(b−1). At this time, there are (2b+1) PMOS transistors. There are also (2b+1) PMOS transistors at the end of reference current. The number of current mirrors and parasitic parameters at both sides are balanced. The number of the third PMOS transistors PM3 in different circuit structures is also different, and can be set according to specific circuit results, which is not limited to this embodiment. By providing the current mirror parasitic parameter matching module 122, a current mirror parasitic current matched with the current mirror in each of the sensitive amplifier can be introduced into the read current Iref, such that the variation trend of the read reference current Iref is the same as that of the read current Iread, thereby eliminating the phenomenon of pseudo-read and reducing the time for reading out signals. The current conversion module restores the read reference voltage Vref to a read reference current Iref, including a sixth PMOS transistor PM6. The comparison module is connected with the current mirror and the current conversion module, and compares the read current Iread in the selected memory cell 111 with the read reference current Iref, and the comparison result indicates the signal stored in the selected memory cell 111, comprising the seventh PMOS transistor PM7, the eighth PMOS transistor PM8, the fourth NMOS transistor NM4, the fifth NMOS transistor NMS, the sixth NMOS transistor NM6, and the seventh NMOS transistor NM7. The drain terminal of the fourth PMOS transistor PM4 is connected to the second damper tube 121, forms a current mirror together with the fifth PMOS transistor PM5 and the seventh PMOS transistor PM7, which mirrors the read current Iread of the selected memory cell 111 to the drain terminals of the fifth PMOS transistor PM5 and the seventh PMOS transistor PM7. The drain terminal of the fourth NMOS transistor NM4 is connected to the drain terminal of the fifth PMOS transistor PM5, and forms a current mirror together with the seventh NMOS transistor NM7. The first PMOS transistor PM1, the sixth PMOS transistor PM6 and the eighth PMOS transistor PM8 in the read reference circuit 2 together form a current mirror, which mirrors the read reference current Iref to the drain terminals of the sixth PMOS transistor PM6 and the eighth PMOS transistor PM8. The drain terminal of the fifth NMOS transistor NM5 is connected to the drain terminal of the sixth PMOS transistor PM6, and forms a current mirror together with the sixth NMOS transistor NM6. The drain terminal of the sixth NMOS transistor NM6 is connected with the drain terminal of the seventh PMOS transistor PM7 to be used as a first output end of the comparison module. The drain terminal of the seventh NMOS transistor NM7 is connected with the drain terminal of the eighth PMOS transistor PM8, being used as a second output end of the comparison module. The first output end and the second output end of the comparison module are differential outputs. An R terminal of the SR latch is connected to the first output end of the comparison module. An S terminal of the SR latch is connected to the second output end of the comparison module. The read voltage of the selected memory cell 111 is obtained according to an output signal of the comparison module.

Example Two

Figure 6:
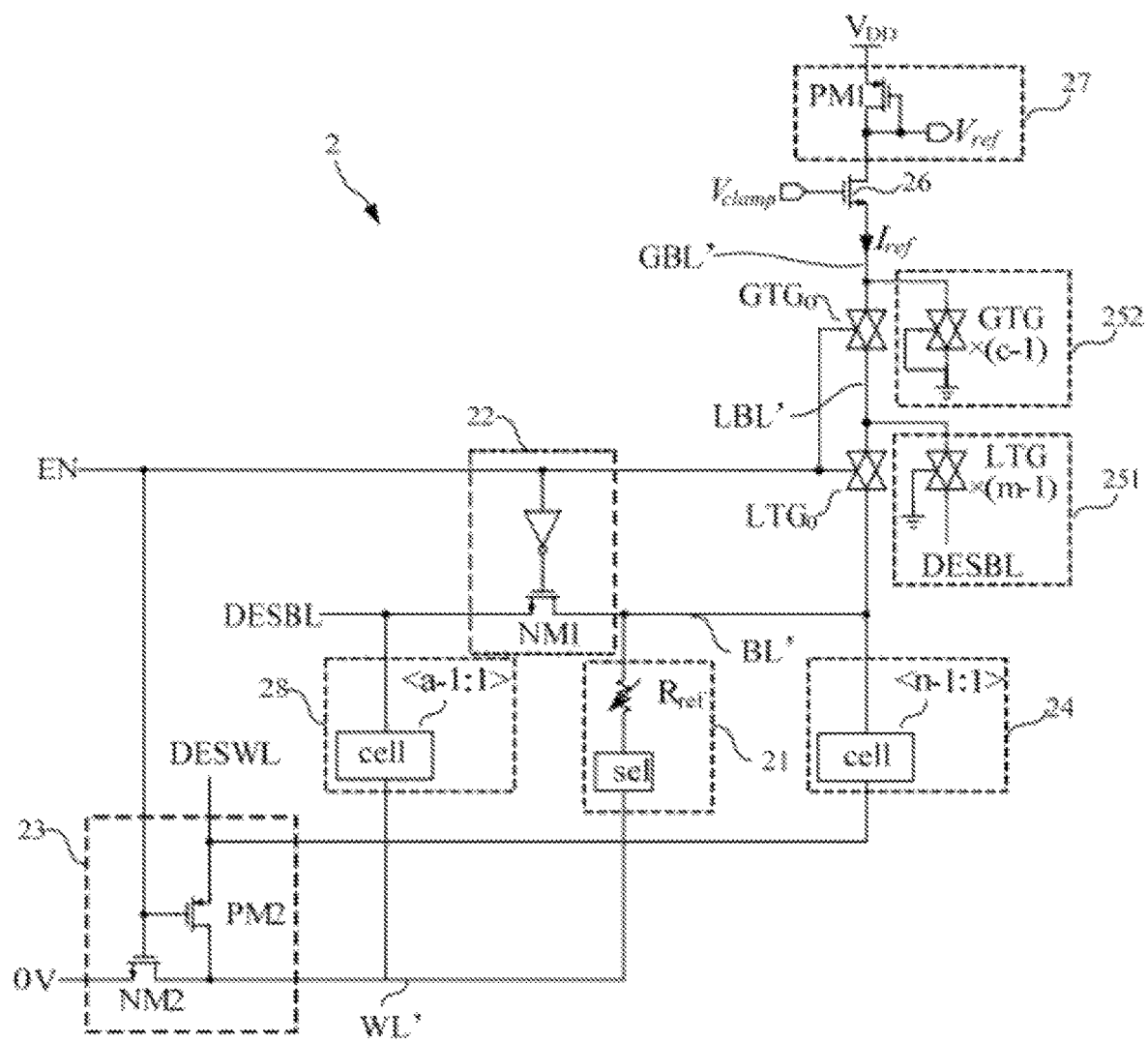
FIG. 6 shows another embodiment of the read reference circuit according to the present invention.

As shown in FIG. 6, the present embodiment provides a read-out circuit for a three-dimensional memory, and the structure thereof is similar to that of Embodiment 1, except that the read-out circuit for a three-dimensional memory further comprises: a word line matching module connected between the reference word line WP and the deselected bit line DESBL and used for providing the electric leakage on the word line to match the electric leakage of the memory cells on the word line in the three-dimensional memory cell array 1.

Specifically, as shown in FIG. 6, the word line matching module 28 includes (a−1) memory cells connected in parallel, wherein a is the number of bit lines that are connected to the same word line in the three-dimensional memory cell array 1.

Correspondingly, the first damper tube 26 obtains read reference current Iref according to the reference resistor value, the bit line parasitic parameter and the electric leakage provided by the bit line matching module 24, the electric leakage provided by the word line matching module 28 and the transmission gate parasitic parameter provided by the transmission gate parasitic parameters matching module 25.

The structure and functions of other modules are the same as those in Embodiment 1, and details thereof are not described herein again.

As shown in FIGS. 3-9, the present invention further provides a read-out method for a three-dimensional memory comprising:

Step S1: selecting one word line and one bit line, connecting one memory cell in the three-dimensional memory cell array to a sensitive amplifier, wherein the sensitive amplifier reads the read current of the memory cell; at the same time that the bit line, the word line and the sensitive amplifier start to work, the read reference circuit starts to work and generates a dynamic read reference current, wherein the transient value of the read reference current is between read low-resistance state unit current and read high-resistance state unit current.

Figure 7:
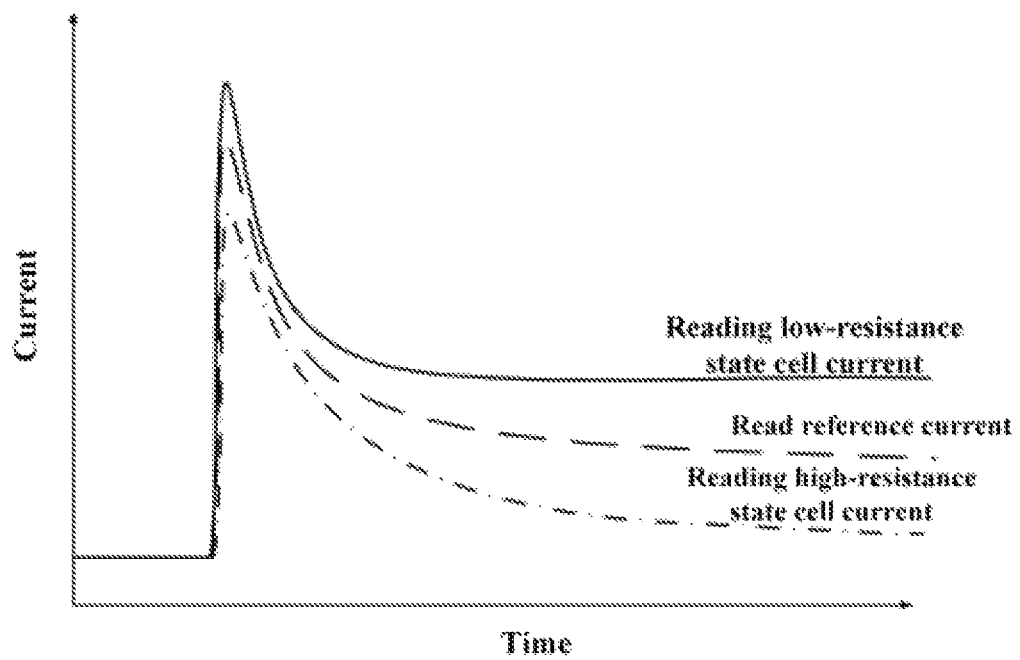
FIG. 7 is a schematic diagram showing the comparison between the read current and the read reference current in the read circuit of the three-dimensional memory according to the present invention.

Specifically, as shown in FIG. 3, in this embodiment, taking the lower memory cell in the first row and the first column as an example, the first word line $WL_{DN\_1}$ is set at a low level, and the remaining word lines are set as the deselected word line voltages. At the same time, the first local transmission gate LTG1 and the first GTG1 are turned on. At this time, the current signal connected to the first bit line BL1 is output to the sensitive amplifier 12. The signal connected to the first bit line BL1 includes the current in the selected lower memory cell in the first row and the first column, the current generated by the parasitic capacitance and the parasitic resistance in the memory cell of the half-gated memory cell, the leakage current of the half-gated memory cell, and the current generated by the parasitic capacitances and the parasitic resistances in the ungated transmission gate. In addition, the read current Iread received by the sensitive amplifier 12 gradually increases with the charging process of parasitic capacitance, and then slowly decreases, as shown in FIG. 7.

Specifically, as shown in FIGS. 4-6, when the first word line $WL_{DN\_1}$ is at a low level, the first local transmission gate LTG1 and the first global transmission gate GTG1 are turned on; at the time that the sensitive amplifier 12 starts to work, the enable signal EN is enabled, and a read reference current Iref is generated at the source terminal of the first damper tube 26. The read reference current Iref comprises the current on the reference resistor in the reference unit 21, the current generated by the parasitic capacitances of the memory cell provided by the bit line matching module 24, the electric leakage on the memory cell, the electric leakage of the memory cell provided by the word line matching module 28, and the current generated by the parasitic resistances and the parasitic capacitances provided by the local transmission gate parasitic parameter matching unit 251 and the global transmission gate parasitic matching unit 252. Likewise, the read reference current Iref slowly increases with the charging process of the parasitic capacitance, and then gradually decreases. The variation trend of the read current Iref is the same as that of the read current Iread, thereby eliminating the phenomenon of pseudo-read and reducing the time for reading out signals. Bit line parasitic parameters and electric leakage are introduced into the read reference current Iref, such that an array bit line parasitic effect and electric leakage generated when a memory cell is read is counteracted. Electric leakage on a word line is introduced into the read reference current Iref, such that electric leakage on a word line when a memory cell is read is counteracted. A transmission gate parasitic parameter is introduced into the read reference current Iref, such that an array transmission gate parasitic effect generated when a memory cell is read is counteracted. As shown in FIG. 7, the read reference current Iref is a dynamic value whose transient value is between the read low-resistance unit current and the read high-resistance unit current.

Step S2: acquiring the read current of the selected memory cell, and comparing the reading current of the selected memory cell with the read reference current to generate a read out voltage signal of the selected memory cell.

Specifically, as shown in FIG. 6, the second damper tube 121 generates the read current Iread of the memory cell 111 under the control of the clamp voltage Vclamp and transmits the read current Iread to the gate terminal of the seventh NMOS transistor NM7 through the current mirror. At the same time, the current mirror parasitic parameter matching module 122 introduces a current mirror parasitic parameter into the read current Iread to match the mirror parameter of the read current of the selected memory cell with the mirror parameter of the reference current, such that the variation trend of the read reference current Iref is consistent with that of the read current Iread, thereby eliminating the phenomenon of pseudo-read and reducing the time for reading out signals, as shown in FIG. 7. The read reference voltage Vref is restored to the read reference current Iref, and is transmitted to the gate terminal of the sixth NMOS transistor NM6. When the memory cell 111 is a low-resistance memory cell, Iread>Iref; the drain current of the fourth NMOS transistor NM4 rises; the connection of the fourth NMOS transistor NM4 makes it equivalent to a diode, and therefore the gate voltage of the fourth NMOS transistor NM4 will rise, and the gate voltage of the seventh NMOS transistor NM7 will also increase, and the gate voltage of the sixth NMOS transistor NM6 will decrease. At this time, the output voltage $V_2$ of the second output end of the comparison module will drop to 0V, and the output voltage $V_1$ of the first output end of the comparison module will rise to be close to the supply voltage $V_{DD}$. When the memory cell 111 is a high-resistance state memory cell, Iread<Iref; the current at the drain terminal of the fourth NMOS transistor NM4 will drop; and the connection of the fourth NMOS transistor NM4 may make it equivalent to a diode, so the gate voltage of the fourth NMOS transistor NM4 will drop, and the gate voltage of the seventh NMOS transistor NM7 will also drop while the gate voltage of the sixth NMOS transistor NM6 will rise. At this time, the output voltage $V_2$ at the second output end of the comparison module will rise to be close to the supply voltage $V_{DD}$, and the output voltage $V_1$ at the first output end of the comparison module rises to be close to 0V. The output voltages $V_1$ and $V_2$ of the comparison module are output to the SR latch to obtain the output signal DO. When the read current Iread of the selected memory cell is greater than the reference current Iref, the SR latch outputs a high level. When the read current Iread of the selected memory cell is less than the reference current Iref, the SR latch outputs a low level.

Figure 2:
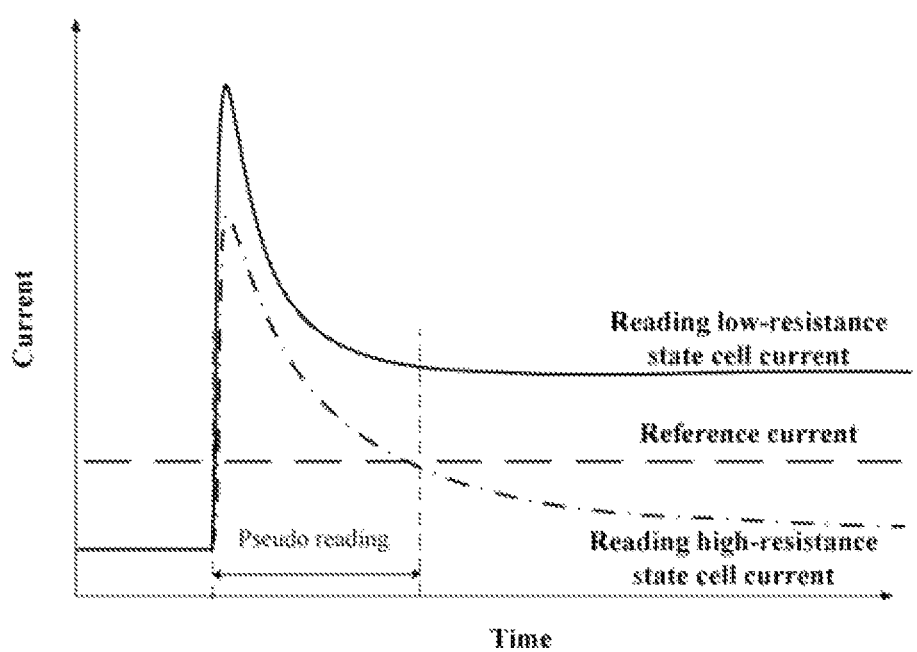
FIG. 2 is a principle diagram showing how the phenomenon of the pseudo-reading in the prior art affects the reading time.

As shown in FIG. 7, the read reference current of the present invention is already between the read low-resistance unit current and the read high-resistance unit current during the current rising phase. The time for pseudo-reading is greatly reduced compared to FIG. 2.

Figure 8:
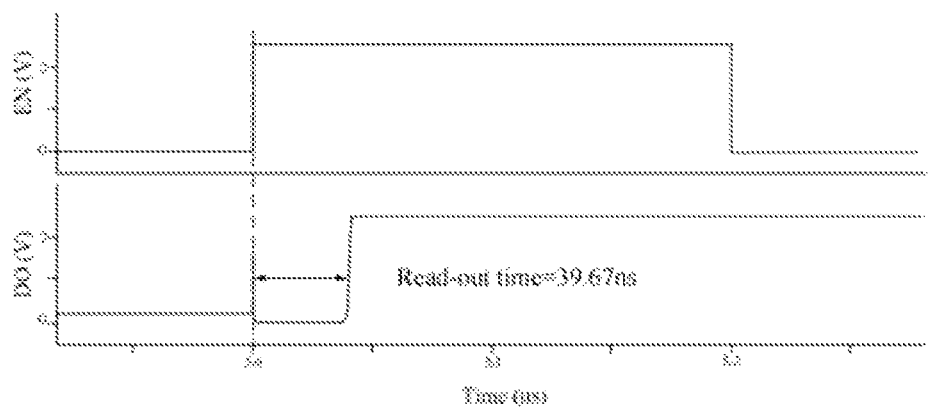
FIG. 8 is a simulation result of read low-resistance state when the read-out circuit for three-dimensional memory according to the present invention is applied to a 64 Mbit phase change memory chip.
Figure 9:
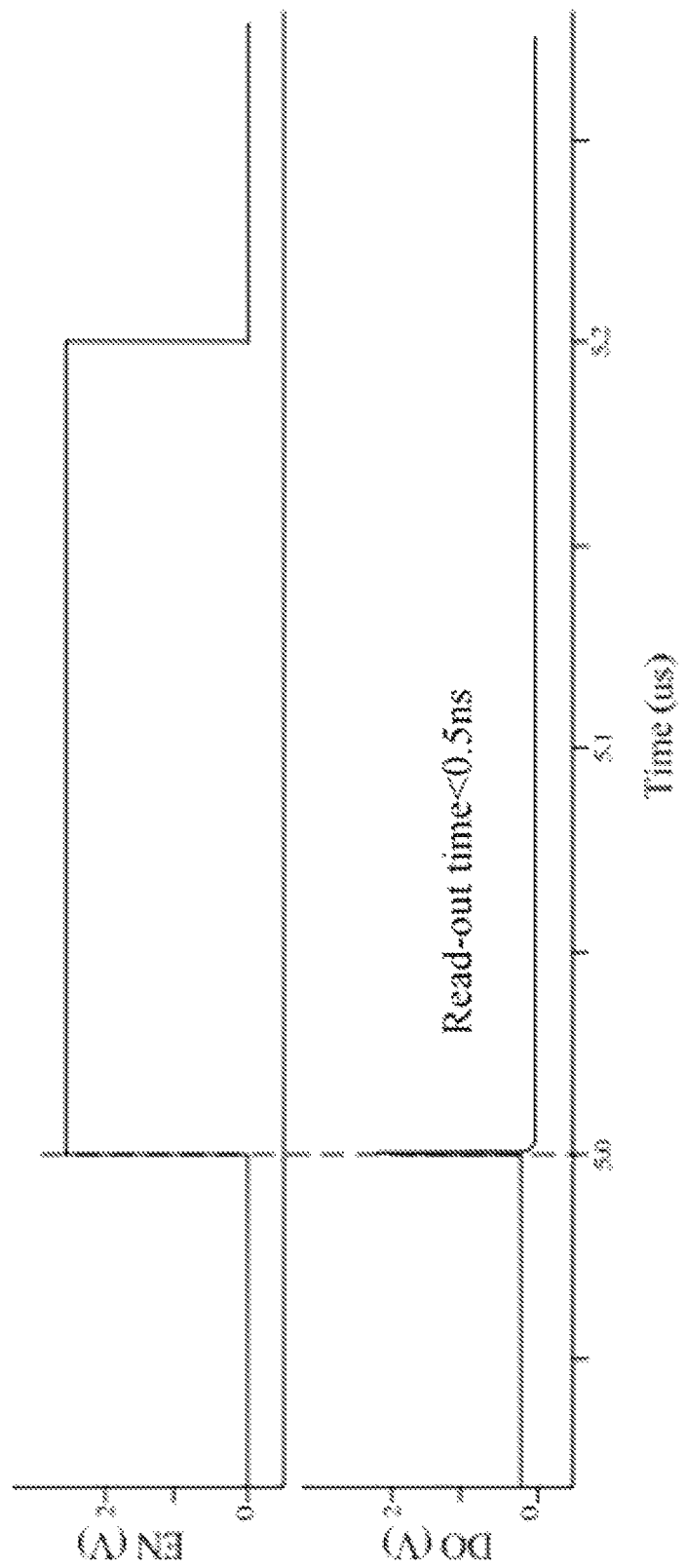
FIG. 9 is a simulation result of read high-resistance state when the read-out circuit for three-dimensional memory according to the present invention is applied to a 64 Mbit phase change memory chip.

FIGS. 8-9 show simulation results of the read-out circuit for three-dimensional memory of the present invention being applied to a phase change memory. The chip uses 40 nm process, a capacity thereof is 64 Mbit, and cross-stacked three-dimensional storage structure is used. The chip has two layers of memory cells, two layers of word lines, one layer of bit line, n=1024, a=1024, m=16, c=16 and b=16, wherein EN signal is an enable signal. With the increasing of the EN signal, the sensitive amplifier begins to read. When a low resistance is read (low resistance state), the read time is 39.67 ns; when a high resistance is read (high resistance state), the read time is less than 0.5 ns. The random reading time of the read-out circuit for a tree-dimensional memory according to the present invention is 39.67 ns. In contrast, the read time of the 64 Mbit three-dimensional memory chip using the conventional read-out method is about 185.3 ns.

As described above, the read-out circuit and read-out method for three-dimensional memory according to the present invention have the following beneficial effects:

1. In the read-out circuit and read-out method for a three-dimensional memory according to the present invention, the read reference circuit does not start to work until the read signal is sent; the matching of the parasitic parameter of the bit line, the matching of the parasitic parameters of the transmission gate and the matching of leakage current of bit line and word line are introduced into the read reference current, and the matching of the parasitic parameters of current mirror is introduced into the read current, such that the transient curve of the reading reference current is between the reading high-resistance state current and the reading low-resistance state current, thereby eliminating the phenomenon of pseudo-reading and reducing the read-out time.

2. In the read-out circuit and read-out method for a three-dimensional memory according to the present invention, the read reference current and the read current have the same leakage current, thereby reducing misreading.

3. The read-out circuit and read-out method for three-dimensional memory according to the present invention can greatly reduce the read-out time for a three-dimensional memory with a scale from 1 Mb to 1 Tb, and has a wide range of applications.

In summary, the present invention provides a read-out circuit and a read-out method for a three-dimensional memory, comprising a read reference circuit and a sensitive amplifier, wherein the read reference circuit produces read reference current capable of quickly distinguishing read low-resistance state unit current and read high-resistance state unit current. The read reference circuit comprises a reference unit, a bit line matching module, a word line matching module and a transmission gate parasitic parameter matching module. With respect to the parasitic effect and leakage current of the three-dimensional memory in the plane and vertical directions, the present invention introduces the matching of bit line parasite parameters, leakage current and transmission gate parasitic parameters into the read reference current, and introduces the matching of parasitic parameters of current mirror into the read current, thereby eliminating the phenomenon of pseudo read and reducing the read-out time. The read-out circuit and the read-out method for a three-dimensional memory according to the present application have a fast signal transmission, a wide application range and high read-out accuracy. Therefore, the present invention effectively overcomes various disadvantages of the prior art and has a high industrial value.

The above-mentioned embodiments are just used for exemplarily describing the principle and effects of the present invention instead of limiting the present invention. One skilled in the art may make modifications or changes to the above-mentioned embodiments without departing from the spirit and the scope of the present invention. Therefore, all equivalent modifications or changes made by one skilled having common knowledge in the art without departing from the spirit and technical concept disclosed by the present invention shall be still covered by the claims of the present invention.

What is claimed is:

1. A read-out circuit for a three-dimensional memory, characterized in that the read-out circuit for a three-dimensional memory at least comprises:
   a three-dimensional memory cell array comprising at least one three-dimensional memory cell sub-array and a plurality of sensitive amplifiers corresponding to the three-dimensional memory cell sub-array; wherein each of bit lines in the three-dimensional memory cell array is respectively connected with the corresponding sensitive amplifiers through transmission gates; the sensitive amplifiers are connected with a plurality of read reference circuits and corresponding memory cells and compares a read reference current with a current read out from a selected memory cell to generate a read-out voltage signal of the selected memory cell;
   one of the plurality of read reference circuits for generating a read reference voltage or a read reference current, comprising: a reference unit, a bit line matching module, a transmission gate parasitic parameter matching module and a first damper tube;
   wherein the reference unit is connected between a reference word line and a reference bit line for providing a reference resistance value;
   the bit line matching module is connected between the reference bit line and a deselected word line for providing bit line parasitic parameters and electric leakage to match the bit line parasitic parameters in the three-dimensional memory cell array and the electric leakage of the memory cell on the bit line;
   the transmission gate parasitic parameter matching module is connected between the reference bit line and a source terminal of the first damper tube for providing transmission gate parasitic parameters to match the transmission gate parasitic parameters in the three-dimensional memory cell array;
   the first damper tube obtains the read reference current according to the bit line parasitic parameters and electric leakage provided by the reference resistance value and the bit line matching module, and the transmission gate parasitic parameter provided by the transmission gate parasitic parameters matching module.

2. The read-out circuit for a three-dimensional memory according to claim 1, characterized in that: the read-out circuit for a three-dimensional memory further comprises: a word line matching module connected between the reference word line and a deselected bit line for providing electric leakage on a word line to match the electric leakage of the memory cells on the word line in the three-dimensional memory cell array; the first damper tube obtains the read reference current according to the reference resistance value, the bit line parasitic parameter and the electric leakage provided by the bit line matching module, the electric leakage provided by the word line matching module, and the transmission gate parasitic parameters provided by transmission gate parasitic parameter matching module.

3. The read-out circuit for a three-dimensional memory according to claim 2, characterized in that: the word line matching module comprises (a−1) memory cells connected in parallel, wherein a is the number of bit lines connected to the same word line in the three-dimensional memory cell array.

4. The read-out circuit for a three-dimensional memory according to claim 1, characterized in that: the reference unit comprises a reference resistor and a gating tube, wherein one end of the gating tube is connected to the reference word line, and one end thereof is connected to an end of the reference resistor; and the other end of the reference resistor is connected to the reference bit line.

5. The read-out circuit for a three-dimensional memory according to claim 4, characterized in that: the resistance value of the reference resistor is between the maximum of low-resistance state and the minimum of high-resistance state.

6. The read-out circuit for a three-dimensional memory according to claim 4, characterized in that the selector and a selector in the memory cell are the same type.

7. The read-out circuit for a three-dimensional memory according to claim 1, characterized in that: the bit line matching module comprises (n−1) memory cells connected in parallel, wherein n is the number of word lines that are connected to the same bit line in the three-dimensional memory cell array.

8. The read-out circuit for a three-dimensional memory according to claim 1, characterized in that: the transmission gate parasitic parameter matching module comprises a first transmission gate, a second transmission gate, a local transmission gate parasitic parameter matching unit and a global transmission gate parasitic parameter matching unit; the first transmission gate and the second transmission gate are connected in series between the reference bit line and the source terminal of the first damper tube; a connection line between the first transmission gate and the second transmission gate is used as a local reference bit line; a connection line between the second transmission gate and the first clamper tube is used as a global reference bit line; the local transmission gate parasitic parameter matching unit is connected between the local reference bit line and the deselected bit line for providing the transmission gate parasitic parameters to match the local transmission gate parasitic parameters in the three-dimensional memory cell array; the global transmission gate parasitic parameter matching unit is connected between the global reference bit line and ground for providing transmission gate parasitic parameters to match the global transmission gate parasitic parameters in the three-dimensional memory cell array.

9. The read-out circuit for a three-dimensional memory according to claim 8, characterized in that: the local transmission gate parasitic parameter matching unit comprises (m−1) third transmission gates connected in parallel, wherein m is the number of bit lines connected to the same local bit line; the structure and size of each of the third transmission gates are the same as those of the first transmission gate in the reading reference circuit, and the same as those of each of the local transmission gates in the three-dimensional memory cell array; one end of each of the third transmission gates is connected to the local reference bit line, another end is connected to the deselected bit line, and the control end is connected to the ground.

10. The read-out circuit for a three-dimensional memory according to claim 8, characterized in that: the global transmission gate parasitic parameter matching unit comprises (c−1) fourth transmission gates connected in parallel, wherein c is the number of local bit lines connected to the same global bit line; the structure and size of each of the fourth transfer gates are the same as those of the second transmission gate in the read reference circuit, and the same as those of each of the global transmission gates in the three-dimensional memory cell array; one end of each of the fourth transmission gates is connected to the global reference bit line, another end is connected to the ground, and the control end is connected to the ground.

11. The read-out circuit for a three-dimensional memory according to claim 1, characterized in that: the read reference circuit further comprises: a voltage conversion module for converting the read reference current into a read reference voltage, the voltage conversion module comprises a first PMOS transistor; wherein a source terminal of the first PMOS transistor is connected to power supply voltage, a gate terminal is connected with the drain terminal and is used as the output end of the read reference voltage, and the drain terminal is further connected to the drain terminal of the first damper tube.

12. The read-out circuit for a three-dimensional memory according to claim 1, characterized in that: the read reference circuit further comprises: a bit line driving module connected to an input end of the reference bit line for driving the reference bit line; the bit line driving module comprises a first NMOS transistor, a source terminal of the first NMOS transistor is connected with a deselected bit line signal, a gate terminal of the first NMOS transistor is connected with an inverted signal of an enable signal, and a drain terminal of the first NMOS transistor is connected with the reference bit line.

13. The read-out circuit for a three-dimensional memory according to claim 1, characterized in that: the read reference circuit further comprises: a word line driving module connected to an input end of the reference word line for driving the reference word line; the word line driving module comprises a second NMOS transistor and a second PMOS transistor, a source terminal of the second NMOS transistor is connected to the ground, a gate terminal of the second NMOS transistor is connected to an enable signal, and a drain terminal of the second NMOS transistor is connected to the reference word line; a source terminal of the second PMOS transistor is connected to a deselected word line, a gate terminal of the second PMOS transistor is connected to an enable signal, and a drain terminal of the second PMOS transistor is connected to the reference word line.

14. The read-out circuit for a three-dimensional memory according to claim 1, characterized in that: the sensitive amplifier comprises a second damper tube having a source terminal connected to the memory cell, a current mirror connected with the drain terminal of the second damper tube, a current conversion module connected to the read reference voltage, and a comparison module; a gate terminal of the second damper tube is connected to a clamp voltage; the current mirror extracts the read current in the selected memory cell; the current conversion module converts the read reference voltage into a read reference current; the comparison module is connected with the current mirror and the current conversion module, and compares the read current in the selected memory cell with the read reference current; and the comparison result indicates a signal stored in the selected memory cell.

15. The read-out circuit for a three-dimensional memory according to claim 14, characterized in that: the sensitive amplifier further comprises a current mirror parasitic parameter matching module for counteracting the parasitic effect of the current mirror in each sensitive amplifier; the current mirror parasitic parameter matching module comprises a third NMOS transistor having a gate terminal and a source terminal grounded, and 2(b-1) third PMOS transistor connected in parallel; a source terminal of each of the third PMOS transistors is connected to a supply voltage, a drain terminal of each of the third PMOS transistors is connected to the drain terminal of the third NMOS transistor, and a gate terminal of each of the third PMOS transistors is connected to an input end of the current mirror; the size of each of the third PMOS transistors is the same as that of each transistor in the current mirror, wherein b is the number of the sensitive amplifiers connected to the same read reference circuit in the three-dimensional memory cell array.

16. The read-out circuit for a three-dimensional memory according to claim 1, characterized in that: the deselected word line is connected to a voltage source of the deselected word line, and the voltage of the voltage source causes the memory cell not to be selected.

17. The read-out circuit for a three-dimensional memory according to claim 2, characterized in that: the deselected bit line is connected to a voltage source of the deselected bit line, and the voltage of the voltage source causes the memory cell not to be selected.

18. A method for reading out the read-out circuit for three-dimensional memory according to claim 1, characterized in that: the read-out method for a three-dimensional memory at least comprises:
  selecting one word line and one bit line, and connecting one memory cell in the three-dimensional memory cell array to a sensitive amplifier, wherein the sensitive amplifier reads the read current of the memory cell; wherein
  at the time that the word line, the bit line, and the sensitive amplifier start to work, the read reference circuit begins to work and generates a dynamic read reference current, and a transient value of the read reference current is between a read low-resistance state current and a read high-resistance state current;
  the sensitive amplifier compares the read current of the selected memory cell with the read reference current and generates a read-out voltage signal of the selected memory cell.

19. The read-out method for a three-dimensional memory according to claim 18, characterized in that: the bit line parasitic parameter and the electric leakage on a bit line are introduced into the read reference current to counteract an array bit line parasitic effect generated when a memory cell is read, and the electric leakage of the memory cell on a bit line, thereby eliminating the phenomenon of pseudo-reading reducing the time for reading out signals, and reducing misreading.

20. The read-out method for a three-dimensional memory according to claim 18, characterized in that: the electric leakage on the word line is introduced into the read reference current to counteract the electric leakage of the memory cell on the word line when the memory cell is read, thereby eliminating the phenomenon of pseudo-reading and reducing the time for reading out signals.

21. The read-out method for a three-dimensional memory according to claim 18, characterized in that: a transmission gate parasitic parameter is introduced into the read reference current to counteract the parasitic effect of the array transmission gate generated when the memory cell is read, thereby eliminating the phenomenon of pseudo-reading and reducing the time for reading out signals.

22. The read-out method for a three-dimensional memory according to claim 18, characterized in that: a current mirror parasitic parameter is introduced into the read current of the selected memory cell to match mirror image parameters of the read current of the selected memory cell with mirror image parameters of the reference current, thereby eliminating the phenomenon of pseudo-reading and reducing the time for reading out signals.

23. The read-out method for a three-dimensional memory according to claim 18, characterized in that: when the read current of the selected memory cell is larger than the reference current, the memory cell is in a low-resistance state; when the reading current of the selected memory cell is smaller than the reference current, the memory cell is in a high-resistance state.

* * * * *